(12) United States Patent
Jensen et al.

(10) Patent No.: US 7,635,916 B2
(45) Date of Patent: Dec. 22, 2009

(54) INTEGRATED CIRCUIT PACKAGE WITH TOP-SIDE CONDUCTION COOLING

(75) Inventors: Ronald J. Jensen, Bloomington, MN (US); Richard K. Spielberger, Hannover, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/690,502

(22) Filed: Mar. 23, 2007

(65) Prior Publication Data

US 2008/0272482 A1    Nov. 6, 2008

(51) Int. Cl.
*H01L 23/12* (2006.01)
(52) U.S. Cl. .................. 257/704; 257/705; 257/706; 257/707; 257/710; 257/713; 257/720; 257/E23.102; 257/E23.18; 257/E23.188; 257/E23.193
(58) Field of Classification Search ............ 257/704, 257/710, 924, E23.128, E23.18–E23.193, 257/169, 276, 452, 625, 675, 706, 707, 712–722, 257/796, E23.075, E31.131, E23.051, E23.08–E23.113
See application file for complete search history.

(56) References Cited

U.S. PATENT DOCUMENTS

| 6,091,146 | A * | 7/2000 | Berkely et al. ............... 257/730 |
| 6,724,080 | B1 * | 4/2004 | Ooi et al. .................... 257/704 |
| 6,888,238 | B1 | 5/2005 | Li |
| 2006/0261467 | A1 | 11/2006 | Colgan et al. |

* cited by examiner

*Primary Examiner*—Jasmine J Clark
(74) *Attorney, Agent, or Firm*—Schumaker & Sieffert, P.A.

(57) ABSTRACT

An IC package that employs top-side conduction cooling. The IC package has a low thermal resistance between a substrate housed within the package and the lid of the package. Thermal resistance is decreased by increasing the conduction cross-sections laterally through the package and lid and vertically from the package into the lid. The lid may also be modified with an extended mesa portion that reduces the gap between the lid and the IC. A thermally conductive spacer may also be interposed between the IC and the lid. Also, the package housing body and lid may be made from high thermal conductivity materials having thermal conductivities of 50 W/mK or greater with matching CTE between the lid and the package.

19 Claims, 5 Drawing Sheets

INTEGRATED CIRCUIT PACKAGE WITH TOP-SIDE CONDUCTION COOLING

FIELD

The invention relates to Integrated Circuit (IC) packaging and more particularly to packaging structures that dissipate heat away from a heat generating substrate within a package.

BACKGROUND

Integrated circuits (ICs) generate heat. To prevent excessive temperatures, this heat must be dissipated through the IC package that houses the IC. This heat must also be dissipated through supporting hardware. Packages used in avionics or space applications are typically cooled by conduction from the bottom of a package into a printed wiring board (PWB).

FIG. 1 shows a package 10, comprising lid 12 and a housing body 14. Seated within the housing body 14 is an IC 16. The housing body is mounted to a PWB 18, via pins, solder balls, or solder columns 20. Packages in avionics or space applications are typically cooled by conduction into the PWB as opposed to convection cooling. Many high pincount packages use pins or balls on the bottom of a package for electrical connection to a PWB, which increases the thermal resistance between the package and PWB compared to perimeter leaded packages with full bottom side contact to the PWB. Furthermore, as PWB complexity increases, the number of layers in the PWB increases, and the heat from the package must be conducted through multiple layers (often through vias) before being conducted to the edge of the board, which further increases the thermal resistance of this conduction path. To alleviate these problems, emerging hardware designs attempt to remove heat from the top of the package through heat sinks, heat pipes, cooling plates, or other thermally conducting structures.

Unfortunately, standard hermetically-sealed ceramic packages used in avionics or space applications, have a high thermal resistance or a poor thermal conduction path from the IC to the top side of the package. There is also a large air gap that exists between the IC and the lid, further impending heat conduction. Generally speaking, the only conduction path to the top of the package is laterally through the package to the lid, and laterally across the lid.

FIGS. 2A-C respectively show prior art IC packages 22a-c. Each of the packages comprises a housing body 24 and a lid 26. Such housing bodies are generally made of alumina ceramic, which is a low thermal conductivity material (approx. 14 W/mK), and typical lids and seal rings are made of iron-nickel-cobalt alloy (ASTM F-15), which is a low thermal conductivity metal (approximately 17 W/mK). In addition, there is a small area of contact 27 between the package and lid (usually a solder seal or weld), and lids are thin, so the cross-sections for thermal conduction are small. Thus, these typical features result in high thermal resistance paths 28 and 30, between an IC and the top side or lid of a package.

SUMMARY

A package for housing an IC or heat generating substrate is presented. The package allows heat to be conducted efficiently away from the substrate to the lid (or the top-side), where it can be removed by conduction into a heat sink or cooling plate.

In one example, a package includes a housing body and a lid. The housing body has a cavity for housing a substrate and a cavity wall that is adjacent to the cavity. The cavity wall has an inside perimeter that is separated from an outside perimeter of the lid by a minimum distance of at least 1 mm. A sealing material, which bonds the housing body to the lid, covers a contact area established by the inside perimeter of the cavity wall and the outside perimeter of the lid. The sealing material, for example, may be a material such as gold-tin (AuSn), gold-germanium (AuGe), tin-lead (SnPb), a metal filled glass, or a lead free solder.

As another example, the lid may be made from a first material that has a thermal conductivity of at least 50 W/mK. Further, the housing body may be made from a second material that has a thermal conductivity of at least 50 W/mK. For example, the first material may include aluminum nitride (AlN), beryllium oxide (BeO), or silicon carbide (SiC) and the second material may include AlN or BeO. Preferably, the first and second materials share a common coefficient of thermal expansion. In an alternative example, the housing body may be made from alumina ceramic and the lid may be made from copper tungsten (CuW) or BeO.

To promote heat conduction laterally across the top-side, the lid may have an associated thickness of at least 0.5 mm. The housing body, on the other hand, may have an associated body thickness of at least 2 mm and/or a base thickness of at least 1 mm. Also, a thermal interface material may be interposed between a top surface of the substrate and the lid. In addition, the lid may include a lid mesa that extends towards a top surface of a substrate (e.g., an IC or other type of heat generating device) and the thermal interface material may be interposed between a top surface of the substrate and the lid mesa.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIGS. 2A-C are cross-sections of prior art IC packages;

DETAILED DESCRIPTION

Presented below are IC packages that have a low resistance thermal conduction path between a substrate (e.g., an IC or other heat generating device) housed within the package and the top side or lid of the package. The packages' housing body may be constructed from alumina ceramic or a high thermal conductivity material such as aluminum nitride (AlN) or beryllium oxide (BeO). The lid may also be made from high thermal conductivity material such as AlN, silicon carbide (SiC), copper tungsten (CuW), and BeO. In addition, in various examples, thermal conductivity is improved by increasing the conduction cross-sections laterally through the package and lid, and vertically from the package into the lid. In additional or alternative examples, the lid is modified with an extended mesa portion that reduces the gap between the lid and the IC. A thermally conductive spacer may also be used to improve heat conduction directly into the lid, and includes interposing a thermally conductive material in between the IC and the lid.

Figures 1, 2:
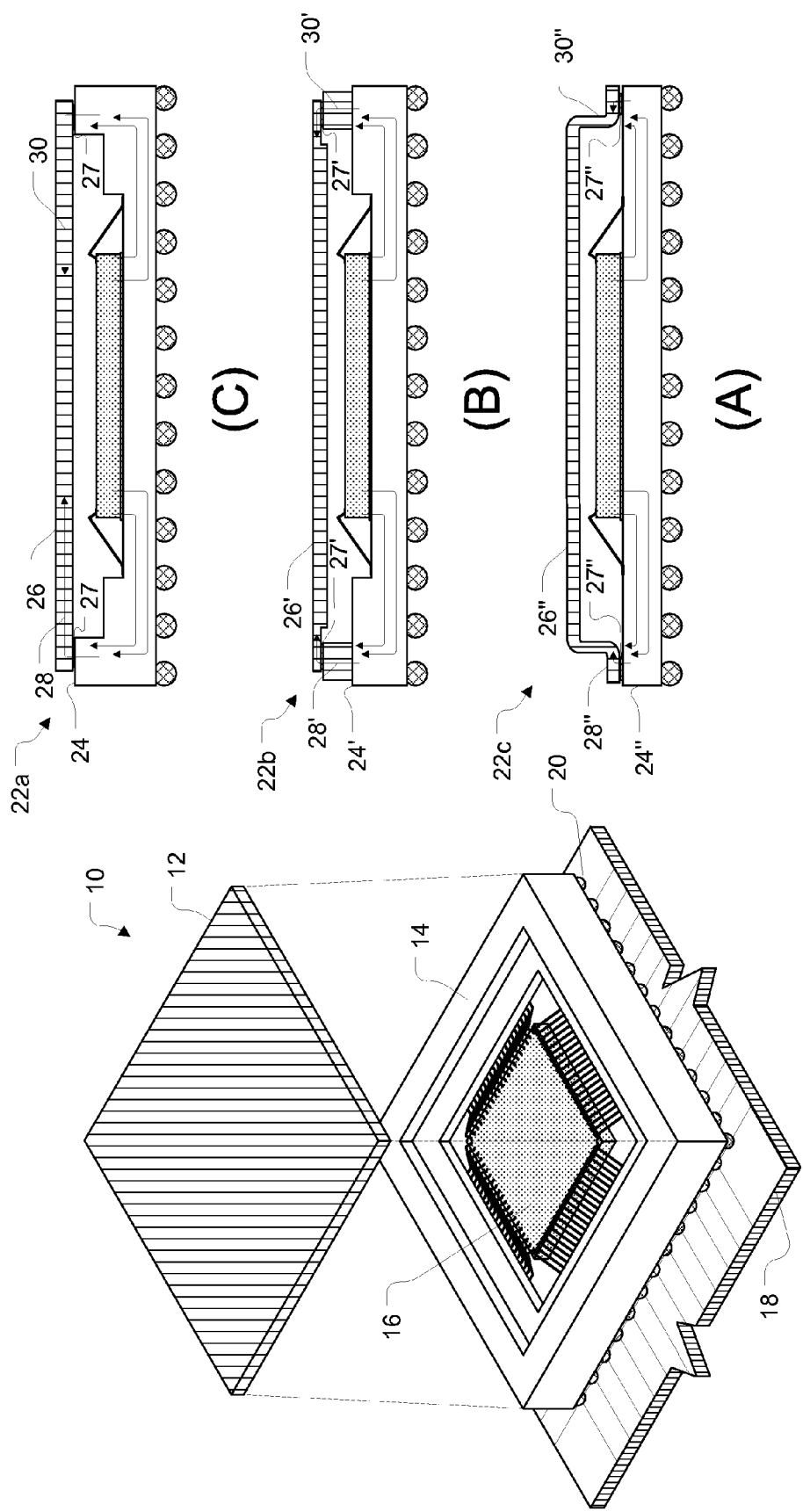
FIG. 1 is an isometric drawing of a prior art IC package.
Figure 3:
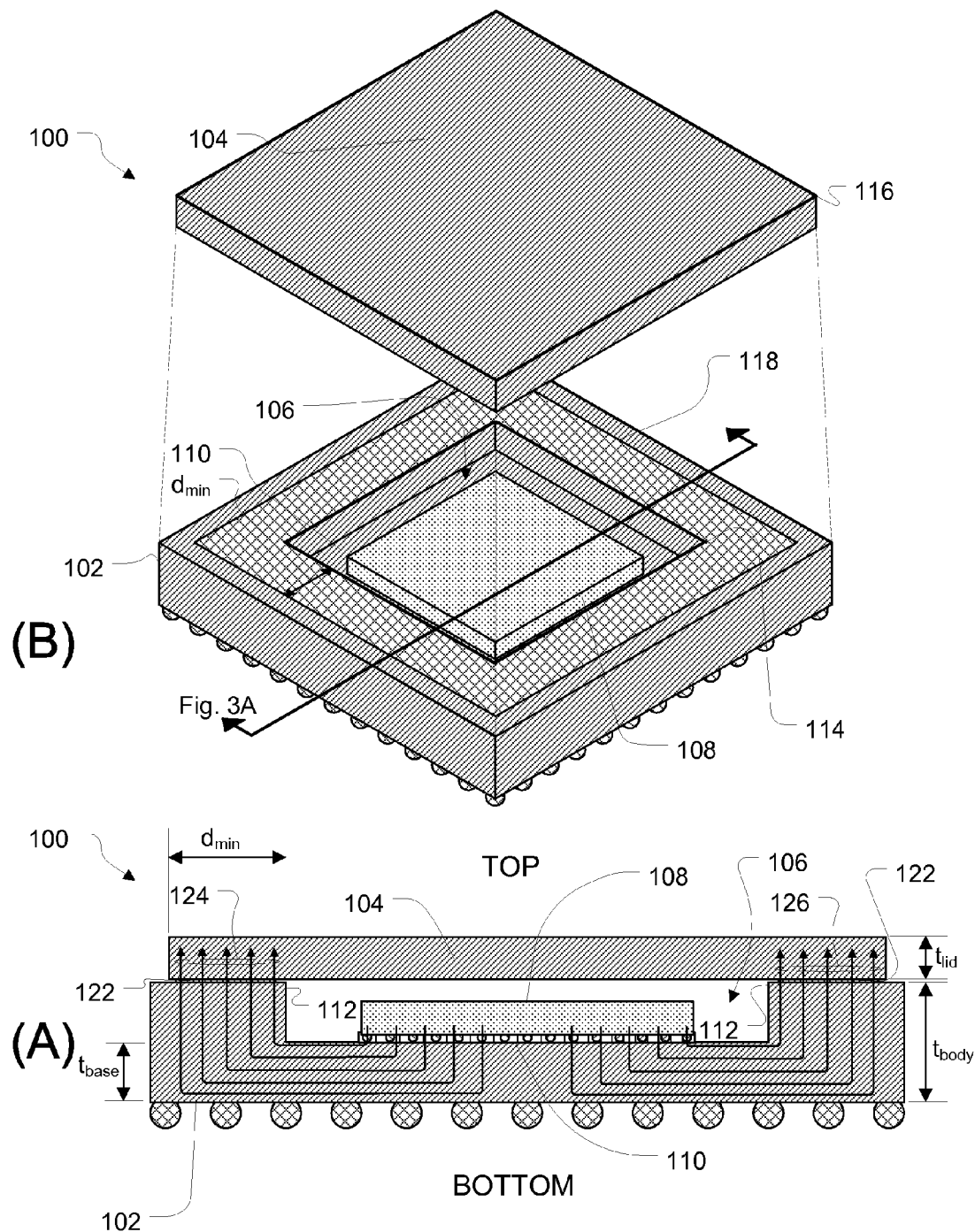
FIGS. 3A-B are an isometric drawing and a cross-section of an IC package that houses a flip-chip type substrate, and where the IC package has large thermal conduction cross-sections, according to an example.
Figure 4:
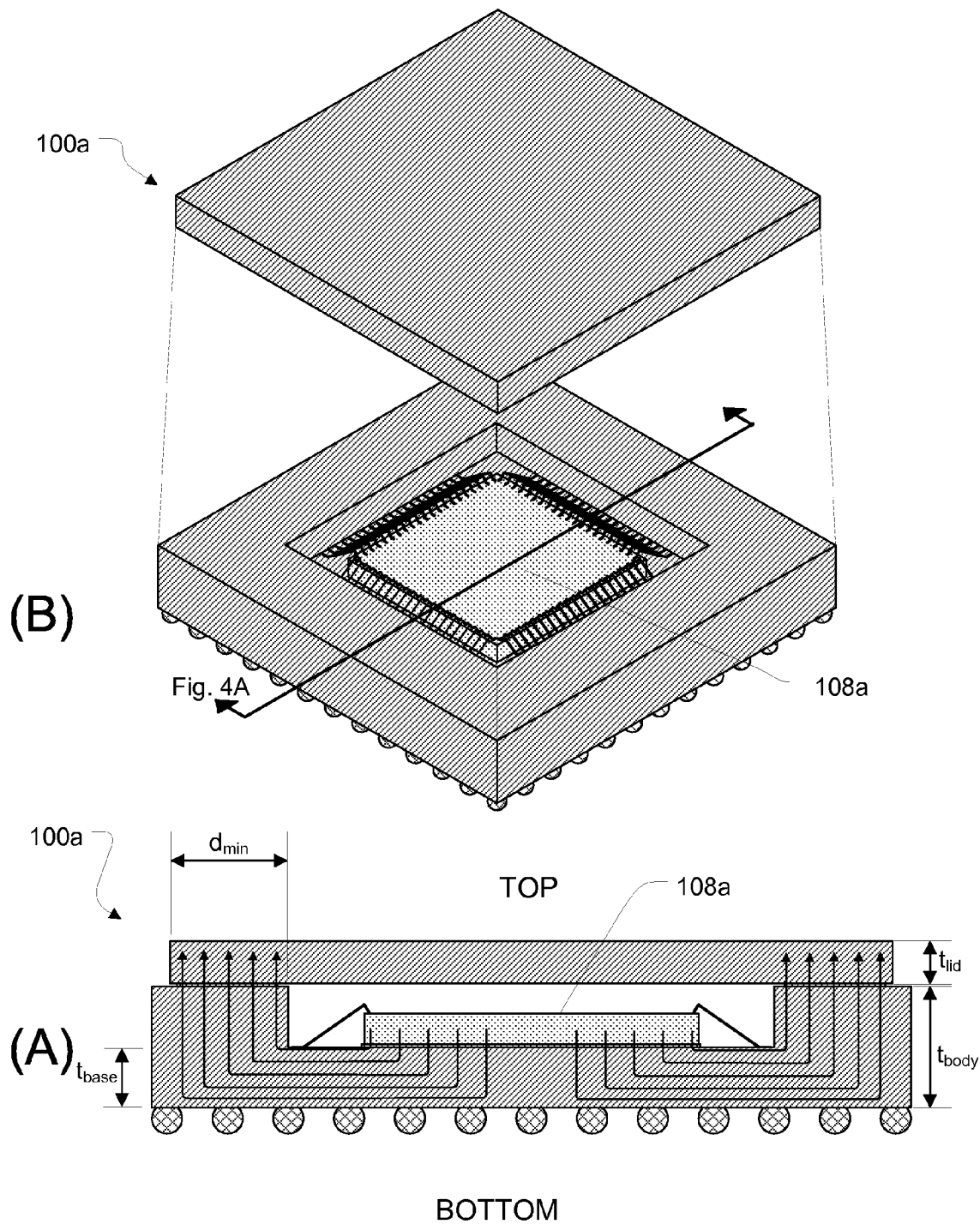
FIGS. 4A-B are an isometric drawing and a cross-section of an IC package that houses a wire-bonded type substrate, and where the IC package has large thermal conduction cross-sections, according to an example.

Turning now to the figures, FIGS. 3A-B respectively shows an isometric drawing and a cross-section of an IC package 100. The package 100 includes a housing body 102 and a lid 104. The housing body 102 includes a cavity 106 for housing a substrate 108. In this example, the substrate 108 is a flip chip (i.e., a face-down attached die). However, alternative types of substrates may be housed within an IC package (see, e.g., FIGS. 4A-B showing a bonded, face-up substrate 108a, housed within a package 100a). Generally speaking, however, the flip chip approach is preferred because it offers more contact area to a lid and allows a thermal interface material to be conducting or insulating (described further with reference to FIGS. 5A-B).

Returning to FIGS. 3A-B, within the cavity 106 is a surface 110 for mounting the substrate. Surrounding the cavity 106 is a cavity wall 112. The cavity wall 112 supports the lid 104. The lid 104 is attached to the cavity wall so that an inside perimeter 114 of the cavity and an outside perimeter 116 of the lid 104 are separated from each other by a minimum distance, $d_{min}$, which defines a contact area 118 on the cavity wall 112. Accordingly, increasing the spacing distance between the perimeters 114, 116, increases the contact area 118, which in turn increases heat-transfer between the housing body 102 and the lid 104. Preferably, good heat conduction is achieved by making $d_{min}$ at least 1 mm wide. Improved heat conduction may be obtained by increasing $d_{min}$ to a width of at least 2 mm, for example.

A sealing material 122 (e.g., solder or glass) bonds the lid 104 to the housing body 102. To maximize heat conduction from the housing body to the lid, the sealing material 122 should coat the entire contact area 118 and cover the entire width $d_{min}$. It should be understood, however, that the sealing material may not cover the entire contact area 118 or distance $d_{min}$. Nevertheless, the sealing material 122 should cover a surface area that is as close as possible to the contact area 118 and it should have a width that is close as possible to $d_{min}$. Suitable seal materials may include gold-tin (AuSn), gold-germanium (AuGe), tin-lead (SnPb), metal filled glasses, or lead free solder (e.g., tin-silver-copper alloys). Alternatively, non-hermetic packages may be sealed with polymeric adhesives filled with thermally conductive particles such as silver, gold, AlN, SiC, or diamond.

To ensure that heat is efficiently conducted through the housing body 102 and the lid 104, both the lid and the housing body preferably comprise high thermal conductivity materials. Such materials have thermal conductivities of at least 50 W/mK. In one example, the preferred housing body and lid material is AlN. In such an example, a multilayer ceramic package may be fabricated from AlN and tungsten (W) or molybdenum metallization, using processes similar to those used for multilayer alumina packages. The thermal conductivity of AlN (about 150 W/mK) is approximately 10 times that of alumina ceramic (about 14 W/mK). Ultimately, this conductivity increase (relative to lower conductivity materials) greatly improves vertical and lateral conduction within the lid and the housing body.

The lid should have a thermal expansion that closely matches the thermal expansion of the housing body. For example, AlN, has a coefficient of thermal expansion (CTE=4.5 ppm/deg C). Therefore, standard iron-nickel-cobalt (ASTM F-15) lids would not be suitable for AlN packages due to their high CTE (6 ppm/degC) compared to AlN. If the housing body is made from AlN, preferably, the lid material comprises AlN; this has a good CTE match to the package. Another suitable lid material would be hot pressed or sintered silicon carbide (SiC, CTE=4.5 ppm/degC), which also has a high thermal conductivity (130-180 W/mK).

Alternatively, the lid and the housing body may both be constructed from BeO, which has a thermal conductivity of about 260 W/mK and a CTE of about 7.2 ppm/degC.

Another alternative is to provide a package that comprises a housing body made from alumina ceramic (CTE=7 ppm/degC) and a lid made from BeO or CuW. CuW has an adjustable CTE based on the copper to tungsten ratio. For example, a composition of twenty parts copper to eighty parts tungsten has a CTE of 7.0 ppm/degC and a thermal conductivity of 170-180 W/mK. Alternatively, a composition of ten parts copper to ninety parts tungsten has a CTE of 6.0 ppm/degC.

Besides increasing the minimum contact distance, $d_{min}$, or using high thermal conductivity materials, increasing the housing body thickness, $t_{body}$, the housing body base thickness, $t_{base}$, and/or the lid thickness, $t_{lid}$, will further improve lateral conduction. In one example, $t_{lid}$ is preferably at least 0.5 mm thick, $t_{body}$ is preferably at least 2 mm thick, and $t_{base}$ is preferably 1 mm thick. Increasing the thicknesses of $t_{lid}$, $t_{body}$, $t_{base}$ and/or $d_{min}$, will accordingly increase the cross-section of thermal conduction paths 124 and 126 that extend from the substrate 108 to the lid 104.

Figure 5:
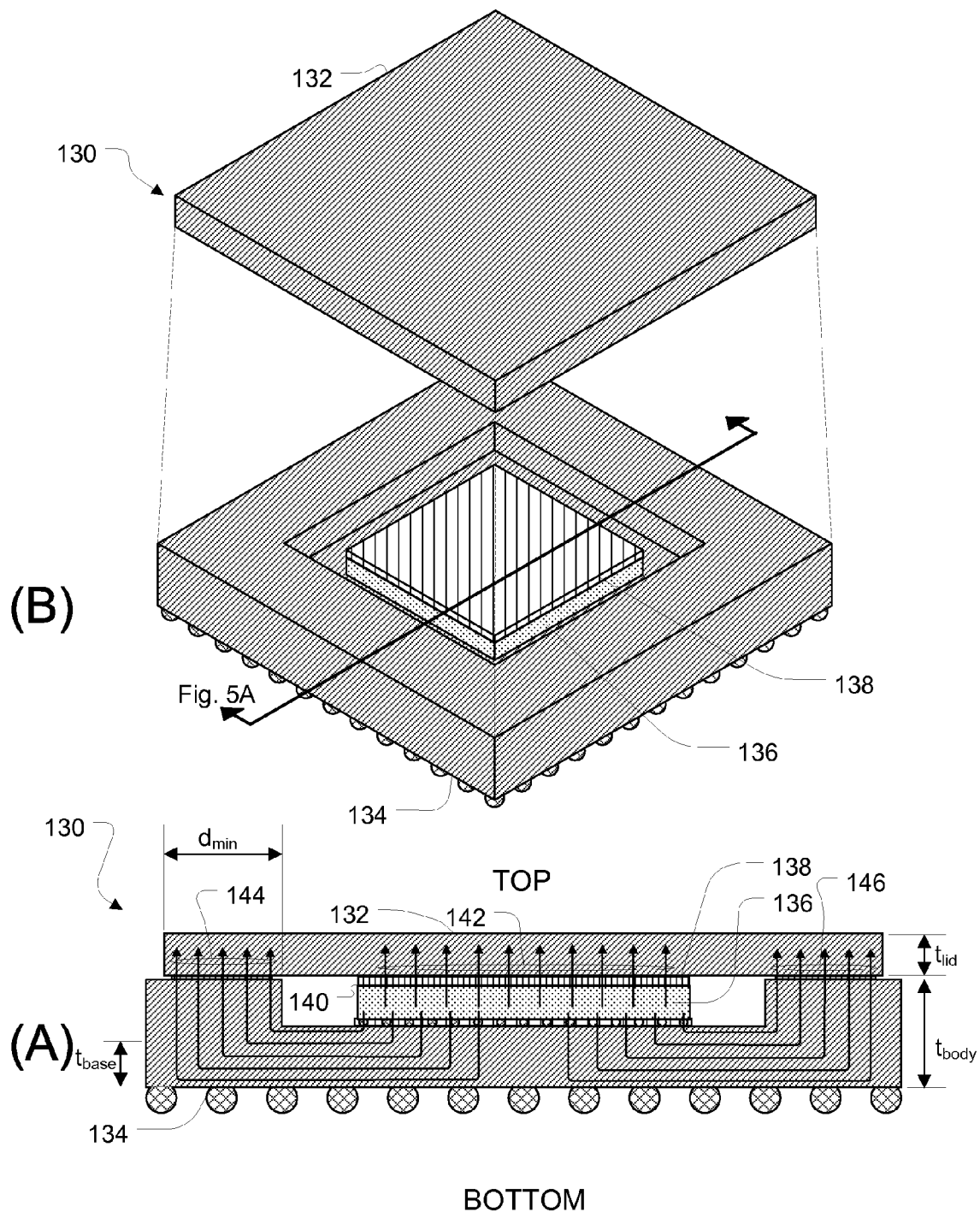
FIGS. 5A-B are an isometric drawing and a cross-section of an IC package that houses a flip-chip type substrate, and where the IC package includes a thermally conductive material interposed between the lid and housing body of the package, according to an example.

Thermal conduction between the lid and the substrate may also be increased by inserting a thermal conductive material between the lid and a top surface of a substrate. FIGS. 5A-B show a package 130 having a lid 132 and a housing body 134. A substrate 136 is housed within a cavity of the housing body 134 and a thermally conductive material 138 is interposed between the lid 132 and a top surface 140 of the substrate 136. If a wire bonded substrate is used (in lieu of a flip-chip substrate, see, e.g., FIGS. 4A-B), the thermally conductive material should be sized so that it does not overlap with wirebonding made to the top-side of the substrate.

Preferably, the thermally conductive material 138 is a low modulus, easily deformed material with high thermal conductivity. Such thermally conductive materials may comprise a polymer in the form of a gel or paste, filled with thermally conductive particles such as metal or ceramic powders or particles. Implementing such a material creates a conduction path 142 from the substrate 136 through the thermally conductive material 138 to the lid 132.

In addition to the conduction path 142, conduction paths 144 and 146 may also be optimized by increasing the width of $d_{min}$ and/or the thicknesses of $t_{body}$, $t_{lid}$ and/or $t_{max}$. (see FIGS. 3A-B).

Figure 6:
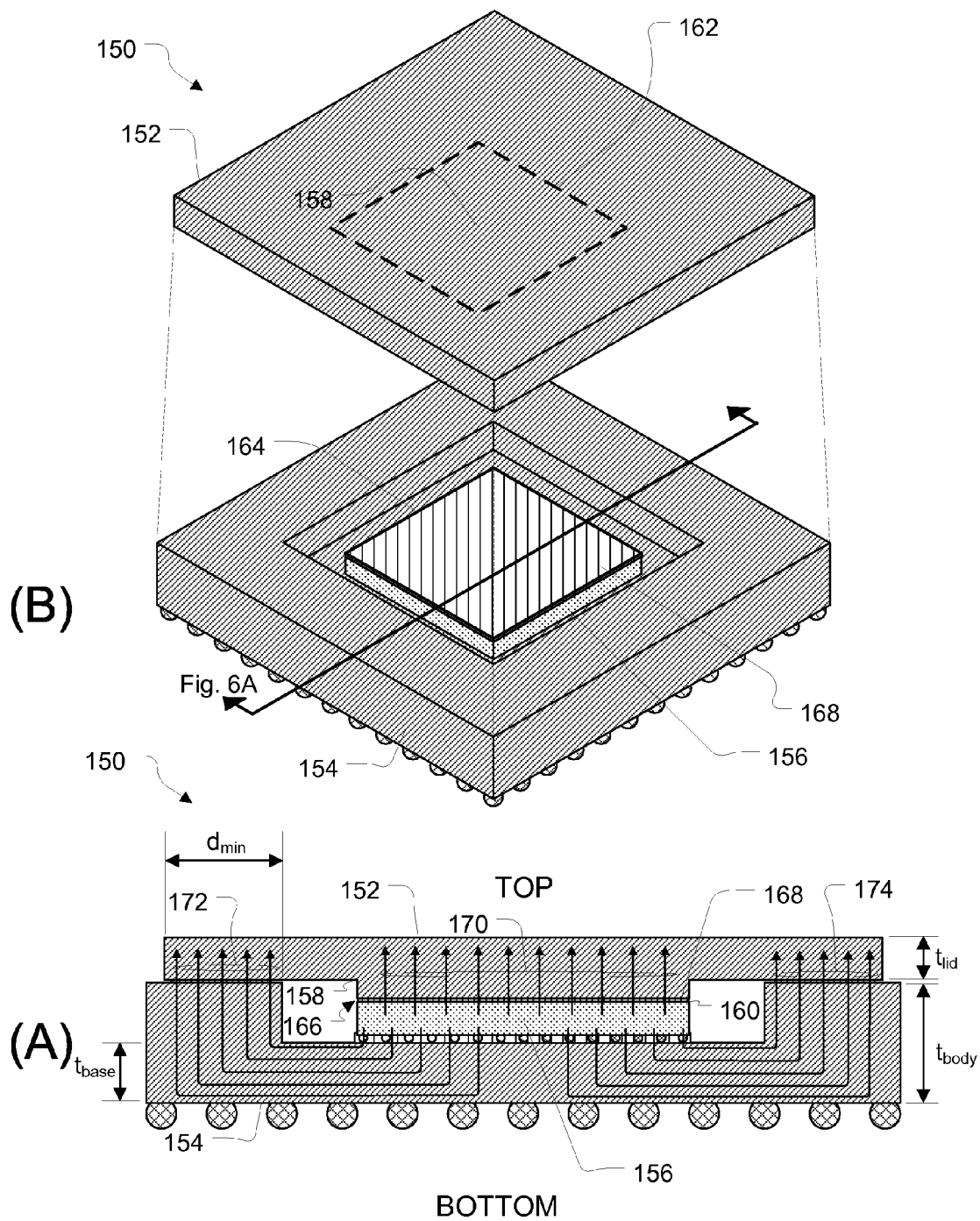
FIGS. 6A-B are an isometric drawing and a cross-section of an IC package that houses a flip-chip type substrate, and where the IC package has a lid that includes a lid mesa, according to an example.

The length of the thermal conduction path between the lid and the substrate may also be optimized by providing a controlled step or mesa extending toward a substrate, which reduces the gap between substrate and the bottom-side of a lid. FIGS. 6A-B show a package 150 having a lid 152 and a housing body 154. A substrate 156 is housed within a cavity of the housing body 154. The lid 152 includes a mesa portion 158 that extends towards a top surface 160 of the substrate 156. Preferably the mesa 158 has a perimeter 162 that is at least as large as a perimeter 164 associated with the substrate 156. Also, when the lid 152 is seated on the housing body 154, a gap 166 may exist between the top surface 160 and mesa 158. This gap, which may have a thickness of about 0.05-0.1 mm, is filled with a thermally conductive material 168 (see FIGS. 5A-B).

Implementing such a mesa creates an improved conduction path 170 from the substrate 156 through the thermally conductive material 168 to the lid 152. In addition to the conduction path 170, conduction paths 172 and 174 may also be optimized by increasing the width of $d_{min}$ and/or the thicknesses of $t_{body}$, $t_{lid}$ and/or $t_{max}$. (see FIGS. 3A-B).

Those skilled in the art will understand that changes and modifications may be made to these examples without departing from the true scope and spirit of the present invention, which is defined by the claims. Thus, the presented figures are intended to generally convey example arrangements of a housing body and a lid, but they should not be viewed as limiting. Also, the term "substrate" is used to generally refer to a variety of different types of heat generating devices that may be housed within a package and is not limited to only including an integrated circuit. Thus, a substrate may comprise, for example, electrical, optical, or micro-mechanical devices.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A package for housing a substrate and dissipating heat away from the substrate through the top-side of the package, comprising:
    a housing body, comprising:
        a cavity for housing a substrate; and
        a cavity wall that is adjacent to the cavity, wherein the cavity wall includes an inside perimeter;
    a lid for enclosing the substrate within the cavity, wherein the lid comprises an outside perimeter, wherein the inside perimeter of the cavity wall and the outside perimeter of the lid are separated by a minimum distance of at least 1 mm; and
    a sealing material interposed between the cavity wall and the lid, wherein the sealing material covers a contact area established by the inside perimeter of the cavity wall and the outside perimeter of the lid.

2. The package of claim 1, wherein the sealing material comprises a material selected from the group consisting of gold-tin (AuSn), gold-germanium (AuGe), tin-lead (SnPb), a metal filled glass, and a lead free solder.

3. The package of claim 1, wherein the lid is made from a first material that has a thermal conductivity of at least 50 W/mK.

4. The package of claim 3, wherein the first material comprises a material selected from the group consisting of aluminum nitride (AlN), silicon carbide (SiC) and beryllium oxide (BeO).

5. The package of claim 1, wherein the housing body is made from a second material that has a thermal conductivity of at least 50 W/mK.

6. The package of claim 5, wherein the second material is selected from the group consisting of aluminum nitride (AlN) and beryllium oxide BeO.

7. The package of claim 5, wherein the lid is made from a first material has a thermal conductivity of at least 50 W/mK, and wherein the first and second materials share a common coefficient of thermal expansion.

8. The package of claim 1, wherein the housing body comprises alumina ceramic or wherein the lid comprises a material selected from the group consisting of copper tungsten (CuW) and beryllium oxide (BeO).

9. The package of claim 1, wherein the lid has an associated thickness that is at least 0.5 mm.

10. The package of claim 1, wherein the housing body has an associated body thickness that is at least 2 mm and a base thickness that is at least 1 mm.

11. The package of claim 1, further comprising a thermal interface material interposed between a top surface of the substrate and the lid.

12. The package of claim 1, wherein the lid includes a lid mesa that extends towards a top surface of the substrate.

13. The package of claim 12, further comprising a thermal interface material interposed between a top surface of the substrate and the lid mesa.

14. A package for housing a substrate and dissipating heat away from the substrate through the top-side of the package, comprising:
    a housing body comprising:
        a cavity for housing a substrate; and
        a cavity wall that is adjacent to the cavity, wherein the cavity wall includes an inside perimeter; and
    a lid comprising:
        an outside perimeter, wherein the inside perimeter of the cavity wall and the outside perimeter of the lid are separated by a predetermined distance, thereby promoting conduction through a top-side of the package; and
        a lid mesa for reducing a spacing distance between the lid and the substrate, wherein the lid mesa extends towards a top surface of the substrate, and wherein the lid comprises a material having a thermal conductivity of at least 50 W/mK.

15. The package of claim 14, further comprising a sealing material interposed between cavity wall and the lid, wherein the sealing material covers a contact area established by the inside perimeter of the cavity wall and the outside perimeter of the lid.

16. The package of claim 14, further comprising a thermal interface material interposed between a top surface of the substrate and the lid.

17. The package of claim 14, wherein the lid comprises a first material selected from the group consisting of aluminum nitride (AlN) and beryllium oxide (BeO), silicon carbide (SiC), and wherein the housing body comprises a second material selected from the group consisting of AlN and BeO.

18. A package for housing a substrate and dissipating heat away from the substrate through the top-side of the package, comprising:
    a housing body having a body thickness of at least 2 mm and a base thickness of at least 1 mm, wherein the housing body is made from a first material that has a thermal conductivity of at least 50 W/mK, and wherein the housing body comprises:
        a cavity for housing a substrate;
        a cavity wall that is adjacent to the cavity, wherein the cavity wall includes an inside perimeter; and
    a lid having an associated minimum thickness of at least 0.5 mm, wherein the lid comprises an outside perimeter that is separated from the inside perimeter of the cavity wall by a minimum distance of at least 1 mm, and wherein the lid is made from a second material that has a thermal conductivity of at least 50 W/mK.

19. The package of claim 18, wherein the lid further comprises a lid mesa that extends towards a top surface of the substrate, and wherein a thermal interface material interposed between a top surface of the substrate and the lid mesa.

* * * * *